United States Patent
Schuster et al.

(10) Patent No.: US 6,226,020 B1
(45) Date of Patent: May 1, 2001

(54) METHOD AND APPARATUS FOR PRODUCING A PRINT, ESPECIALLY A PROOF, BY MEANS OF LASER-INDUCED THERMAL TRANSFER

(75) Inventors: Alfons Schuster, Augsburg; Armin Weichmann, Kissing; Bernhard Feller, Friedberg; Dirk Probian, Gablingen/Lützelburg; Hartmut Fuhrmann, Bobingen; Michael Müller, Augsburg; Thomas Hartmann, Friedberg, all of (DE)

(73) Assignee: MAN Roland Druckmaschinen AG, Offenbach am Main (DE)

( * ) Notice: Subject to any disclaimer, the term of this patent is extended or adjusted under 35 U.S.C. 154(b) by 0 days.

(21) Appl. No.: 09/268,213

(22) Filed: Mar. 15, 1999

(30) Foreign Application Priority Data

Mar. 13, 1998 (DE) ................................. 198 11 031

(51) Int. Cl.⁷ .................................................. B41J 2/325
(52) U.S. Cl. .......................... 347/176; 347/171; 347/262
(58) Field of Search .................................. 347/171, 174, 347/176, 177, 248, 114, 172, 262, 264; 101/467

(56) References Cited

U.S. PATENT DOCUMENTS

| | | | |
|---|---|---|---|
| 3,945,318 | 3/1976 | Landsman | 101/467 |
| 4,598,300 * | 7/1986 | Ono | 347/176 |
| 4,611,217 * | 9/1986 | Iizuka et al. | 347/176 |
| 5,045,865 * | 9/1991 | Crystal et al. | 347/114 |
| 5,072,671 * | 12/1991 | Schneider et al. | 101/467 |
| 5,164,742 | 11/1992 | Baek et al. | 347/234 |
| 5,214,445 | 5/1993 | Kerr | 347/238 |
| 5,246,179 | 9/1993 | Zielinski | 242/388.5 |
| 5,270,733 | 12/1993 | Parsons et al. | 347/215 |
| 5,491,504 * | 2/1996 | Grellman | 347/174 |
| 5,540,509 | 7/1996 | Matsuzawa et al. | 400/206 |
| 5,601,022 * | 2/1997 | Dauer et al. | 101/467 |
| 5,631,688 | 5/1997 | Hibino et al. | 347/171 |
| 5,739,839 | 4/1998 | Iwai et al. | 347/214 |
| 5,777,652 | 7/1998 | Takeuchi | 347/171 |

FOREIGN PATENT DOCUMENTS

| | | |
|---|---|---|
| 44 30 555 | 4/1996 | (DE) . |
| 060 641 A2 | 9/1982 | (EP) . |
| 734 876 A2 | 10/1996 | (EP) . |
| 62-152762 | 7/1987 | (JP) . |
| 6-198938 | 7/1994 | (JP) . |
| 6-219904 | 8/1994 | (JP) . |
| 6-328805 | 11/1994 | (JP) . |
| 7-171992 | 7/1995 | (JP) . |
| 9-150535 | 6/1997 | (JP) . |
| 9-216445 | 8/1997 | (JP) . |
| WO 95/31336 | 11/1995 | (WO) . |

* cited by examiner

*Primary Examiner*—N. Le
*Assistant Examiner*—Hai C. Pham
(74) *Attorney, Agent, or Firm*—Cohen, Pontani, Lieberman & Pavane

(57) ABSTRACT

A method of producing a print, especially a multicolor print, especially for proof purposes, by controlled heating, in accordance with an image, of a surface layer one or more laser beams from a laser imaging unit and by applying the selected surface elements to a substrate. For the purpose of imaging the substrate, applied to a substrate cylinder, use is made of a tape-like transfer tape with a width which is small in relation to the substrate width, so that the gas produced during the laser imaging operation can escape to a sufficient extent because of the substrate and transfer tape being placed opposite each other over a small area. During the imaging operation this transfer tape is guided continuously through between the substrate and the laser beam or beams, close to the substrate surface, and is moved over the substrate width simultaneously and in synchronism with the movement of the laser imaging unit.

35 Claims, 5 Drawing Sheets

METHOD AND APPARATUS FOR PRODUCING A PRINT, ESPECIALLY A PROOF, BY MEANS OF LASER-INDUCED THERMAL TRANSFER

BACKGROUND OF THE INVENTION

1. Field of the Invention

The invention relates to a method and apparatus for producing prints, especially multicolor prints, especially a proof, by means of thermal transfer.

2. Discussion of the Prior Art

The thermal transfer method has been known for years. In principle, a substrate, which may be the final substrate or an intermediate carrier, is brought into contact with a colored layer which has been applied to a carrier, and this colored layer is transferred to the substrate dot by dot, or in accordance with an image, under the action of heat.

By means of differently colored films, it is also possible for a number of colors to be applied one after another, and thus for a colored print to be produced. If the substrate is an intermediate carrier, the finished multicolored image is then transferred to the target substrate in a further step.

U.S. Pat. No. 5,164,742 describes a method in which the action of heat is achieved by means of laser radiation. This means that very small dots can be achieved. However, the method cited has the disadvantage that each film is laid on the substrate over its entire area. Achieving this without the inclusion of air is complicated. Furthermore, only materials which do not gas out during imaging can be used, since otherwise so-called tenting occurs, that is to say the material is lifted, contact between the adjacent regions of the film and the substrate is lost and it is no longer possible for the film to be imaged properly.

This restricts the usability both of the suitable materials and of the imaging arrangement, since during the (very brief) introduction of the energy in the normal case, not only is the material incipiently melted but also a plasma and gas are produced. In particular, limits are placed on the imaging speed, since the shorter the action time, the earlier the plasma is produced. Furthermore, laying a film on a substrate in an external drum imaging means is not possible unless additional fixing is provided.

German Patent DE 44 30 555 C1 discloses a method from another field of application, namely the production of offset printing forms.

SUMMARY OF THE INVENTION

The object of the present invention is, then, to develop a method and an apparatus for producing a print, especially a proof, to the effect that it can be used for transferring material from the film to the substrate in a simple way without the gases which are produced during laser imaging. Furthermore, this method and the apparatus are to be equally suitable for use with smooth and rough substrates.

Pursuant to this object, and others which will become apparent hereafter, one aspect of the present invention resides in a method of producing a print, a tape-like transfer film is used for imaging a substrate applied to a substrate cylinder. The transfer film has a width which is small in relation to the substrate width so that the gas produced during the laser imaging operation can escape to a sufficient degree because of the substrate and the transfer film being placed opposite one another over only a small area. During the imaging operation the transfer film is guided continuously between the substrate and the laser beam so as to be close to the substrate surface. The transfer film is also moved over the substrate width simultaneously and in synchronism with the movement of the laser imaging unit.

The fact that use is made of a tape-like transfer film with a width which is small in relation to the substrate width and, in an external drum imaging arrangement, this transfer film is guided between the substrate and the laser beam, close to the substrate surface, and is moved with respect to the substrate simultaneously and in synchronism with the movement of the laser beam, means that good contact between the thermal transfer material and the substrate, or a defined distance between these two, can be achieved.

The gas which may be formed can escape to a sufficient extent because the thermal transfer tape and the substrate are placed opposite each other over only a small area.

Since the contact or distance between the thermal transfer film and the substrate can be monitored, it can be set to the widest range of different substrates, from very smooth, such as cast-coated paper, to rough, such as roughened metal.

Furthermore, the carrier of the substrate may be considerably thinner than in the case of the whole-area films of the prior art, since the material can be kept in the form of a narrow tape wound up on reels and, at the time of the imaging operation, only has to be guided, under tension, over a short distance.

The fact that the tape-like transfer film, with a width which is only a fraction of the substrate width, can be guided through between the substrate and the imaging unit, in the immediate vicinity of the substrate surface, by means of the tape transport mechanism, and the fact that the tape transport mechanism works together with a traversing unit which is coupled to the imaging unit, means that the transfer film can be moved over the substrate width uniformly with the movement of the printing head. The laser-based thermal printing head, which is controlled in a known way by means of a control unit in accordance with an image to be transferred, introduces heat into the thermal transfer film at each image dot and hence performing a dot-by-dot transfer of the ink-accepting coating of the transfer tape. The entire substrate surface is covered via the rotation of the substrate cylinder and the traversing action axially parallel to the substrate cylinder.

In this case, a number of colors can be applied by using transfer films of different colors, as is also common in the case of conventional thermal transfer. In this case, the transfer materials must have been provided with absorbers for the laser wavelengths used and must have been applied to the carrier material of the transfer tape.

Thus, the tape width of the transfer film may be selected as a function of the number of imaging channels of a laser imaging unit traversing along the axis of a rotating substrate cylinder, that is to say may be designed to be as wide as the printing head.

Another advantageous refinement of the generic method is designing the transfer tape to have a width which permits a number of tracks to be written alongside one another for different imaging operations, and hence permits the transfer tape to be used for a number of imaging operations.

In this case, it is necessary for the position of the point or points at which the laser beam or beams impringe(s), that is to say the writing track of the laser, on the transfer tape to be shifted in each case, so that the tracks do not overlap. Of course, it is possible either for the laser imaging head to be shifted in relation to the common coupling relating to the traversing means or for the tape transport mechanism, at least the two contact rolls 6a, 6b (FIG. 1) to be shifted in relation to the laser imaging head.

One variant of this is independent mechanical traversing of the tape transport mechanism and the laser imaging unit, the synchronized movement being achieved electronically, that is to say the tape transport mechanism and the laser imaging unit have their own traversing drive, the two being shifted synchronously in an electronically coupled manner. Shifting the transfer tape in relation to the laser imaging head in order to provide unused tracks is then simply possible by changing the distance between the tape transport mechanism and the laser imaging head.

A further refinement is that, for the colors used, use is made of one tape composed of differently colored parts rather than different tapes. The tape may have the differently colored parts alongside one another, for example in the sequence black, cyan, magenta, yellow, or may have the differently colored parts one after another.

In another embodiment, during the imaging operation, the transfer film is guided in the same direction as the relative movement of the substrate cylinder and at an identical surface speed. In the preferred embodiment, this is achieved by the transfer tape wrapping partly around the substrate cylinder with a wrap angle of the order of magnitude of at least about 5, preferably 20, degrees. The tape is pressed against the substrate by the tape tension. In still a further embodiment, this pressing-on action can be assisted by a blowing action being executed by means of one or more air jets.

On the one hand, the pressing-on action produces a force which rapidly leads away to the side the gas being produced. On the other hand, it produces a friction force between the substrate and the transfer tape, and this force can be utilized to control the synchronous running. This control makes use of the fact that, in the case of an exactly synchronous speed, the transfer tape adheres to the substrate and is thus conveyed along with it. This requires minimal energy to transport the tape. If a difference in speed occurs, the static-friction changes into sliding friction, which is smaller in terms of magnitude than the static-friction, and thus the amount of energy needed for the tape transport is increased. The energy needed may be determined, for example, via the current needed for the motors of the supply and wind-up rolls.

In yet another embodiment, during the imaging operation, the transfer film is guided through in the same direction as the relative movement of the substrate cylinder but at a speed which is preferably higher by factor 1.2 than the surface speed of the substrate. In this way, because of the air flow between the transfer film and the substrate surface, undefined lifting of the transfer film from the surface of the substrate cylinder during laser imaging may be better prevented.

A further advantageous variant of the method, with the same advantageous effects, consists in that, during the imaging operation, the transfer film is guided through between the substrate surface and the printing head in the direction opposite to the rotational movement of the substrate cylinder, by which means a very rapid relative movement of the transfer film can be achieved.

Which of the variants listed gives the best imaging result depends on the thickness of the transfer film, the tape tension set, the radiation energy and radiation energy density introduced and the transfer material formulation.

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

DETAILED DESCRIPTION OF THE PREFERRED EMBODIMENTS

The method of driving, the construction and the functioning of an imaging unit which emits one or more laser beams are known per se to those in the art and therefore do not require any specific explanation in the present connection.

Figure 1:
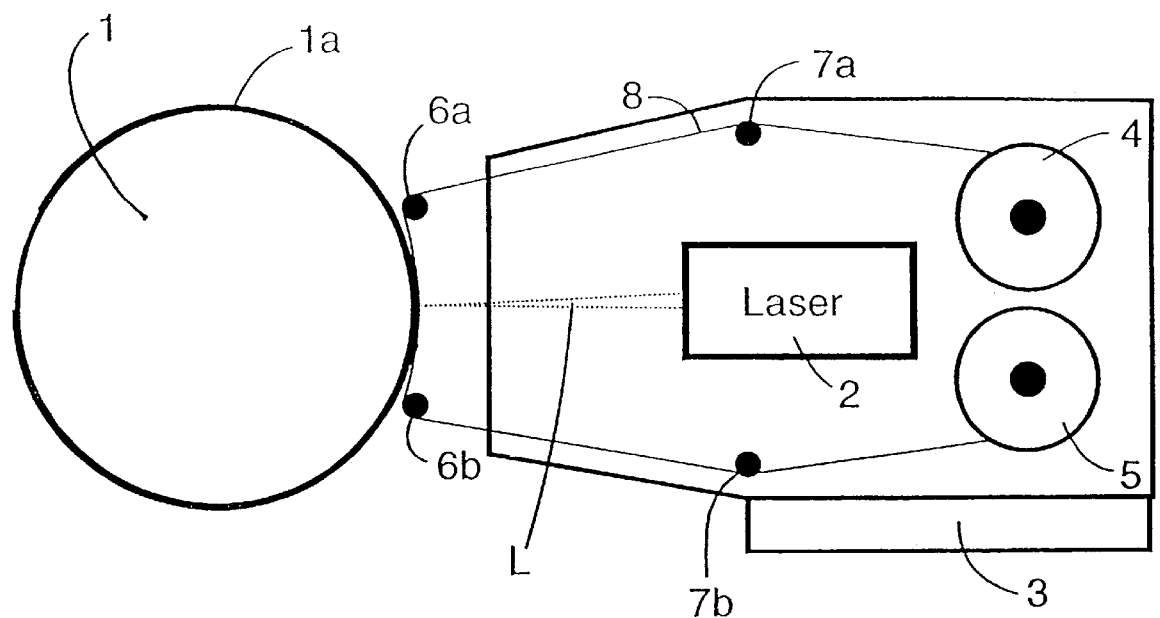
FIG. 1 shows a schematic side view of a thermal transfer apparatus for implementing the method according to the invention with a first tape guide mechanism.

FIG. 1 shows a substrate cylinder 1, to whose surface a substrate 1a has been applied. A tape transport mechanism, comprising a supply roll 4 and a wind-up roll 5 (the identification of the supply roll 4 and wind-up roll 5 is only representative of one running direction of the tape-like thermal transfer film 8, in the opposite direction they would of course have to be referred to as supply roll 5 and wind-up roll 4), two contact rolls 6a, 6b and two guide rolls 7a, 7b, guides a tape-like thermal transfer film 8, referred to below as transfer tape, close to the substrate cylinder 1 or in contact with the substrate 1a.

A laser imaging unit 2 focuses one or more beams onto the transfer tape 8.

In the preferred arrangement, the laser imaging unit 2 and the tape guide mechanism 4, 5, 6, 7 are arranged jointly on the traversing unit 3, by means of which they can be moved over the width B (FIG. 2) of the substrate cylinder 1.

During the imaging operation, the transfer tape 8 is brought into contact, by means of the contact rolls 6a, 6b, with the surface 1a of the substrate cylinder 1 over a wrap angle which is small but sufficient to build up a contact force and hence a frictional force between the transfer tape 8 and the substrate 1a. The contact force is produced via the wrap angle in combination with the tension under which the transfer tape 8 is kept. This tape tension is produced, in a manner which is known and therefore not shown, by means of electronically controllable motors which drive the supply roll 4 and the wind-up roll 5.

Figure 3:
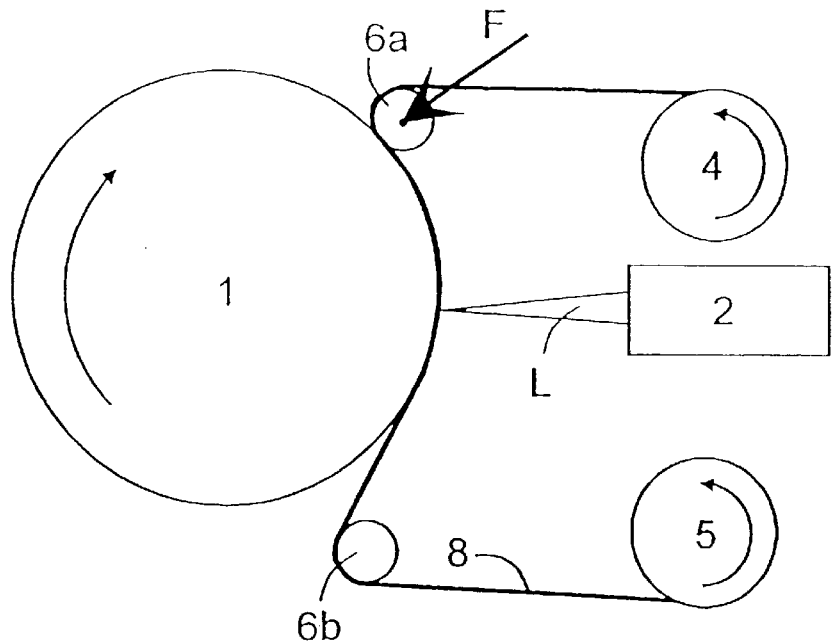
FIG. 3 shows a side view of a further possible way of bringing the transfer film into contact with substrate surface.

The transport direction and the traversing movement are illustrated in FIG. 3 by means of arrows. Obviously, the transfer tape 8 may also be transported in the opposite direction.

The tape tension is preferably in the range of a few newtons and is kept constant during the imaging operation.

In this arrangement, the speed of the transfer tape 8 is precisely equal to the surface speed of the substrate 1a. This exact agreement is necessary since, in the case of synchronous running, if minimal speed differences are nevertheless produced, the so-called stick-slip effect occurs, that is to say the contact between the transfer tape and the substrate oscillates back and forth between the states of static friction and sliding friction. However, optimum transfer is possible only in the adhering state.

The control makes use precisely of the fact that, in the case of an exactly synchronous speed, the transfer tape adheres to the substrate and is thus conveyed along with it with maximum force. This requires minimal energy to transport the tape. If a speed difference occurs, the static friction changes into sliding friction, which is smaller in terms of magnitude and thus increases the energy needed for the tape transport. The energy needed may be determined, for example, via the current needed for the motors of the supply roll and the wind-up roll.

This control requires a specific magnitude of the static friction force, and hence of the contact force, that is to say, for example, over a wrap angle which has to be greater the lower the tape tension and the smoother the substrate surface 1a are. In addition, the pressing-on action produces a force which rapidly leads away to the side the gas being produced.

As an alternative embodiment, the control may also be carried out passively, by a defined speed which differs only very little from the circumferential speed of the substrate being predefined, and the differential speed being compensated for via the expansion of the transfer tape. However, this requires the static friction force to be greater than the force needed for the plastic expansion of the transfer tape.

Figure 2:
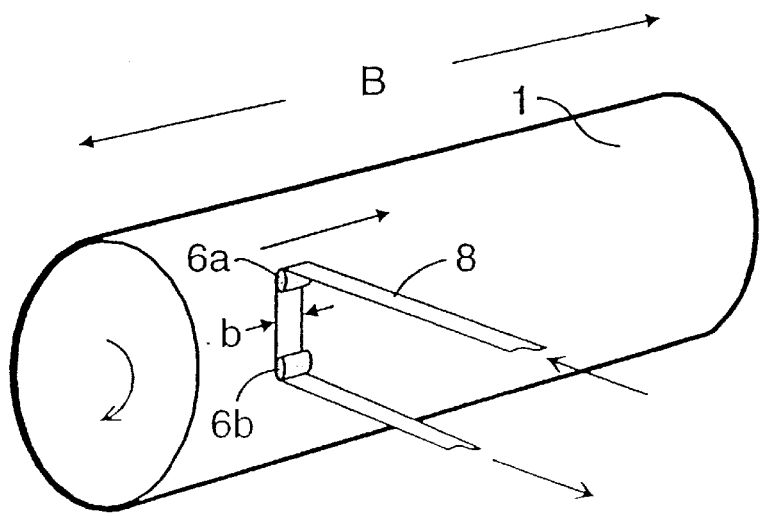
FIG. 2 shows a perspective view of a possible way of bringing the transfer film into contact with the substrate surface.

In FIG. 2, the arrangement of the contact rolls 6a, 6b and hence the action of bringing the transfer tape 8 into contact with the substrate surface have been selected such that the selected region of the transfer tape 8 runs tangentially to the substrate cylinder 1, that is to say without any wrap angle.

FIG. 3 shows another possibility. Here the contact rolls 6a, 6b are arranged in such a way that the guide roll 6a is pressed with a defined pressure F against the substrate cylinder 1. This produces the necessary frictional force by means of the contact force F of the roll 6a. In order that there is no contact with those regions of the substrate which have already been imaged, the tape 8 here may also run obliquely in relation to the imaging track, that is to say the roll is positioned in front of the imaging tracks which have already been written.

Figure 4:
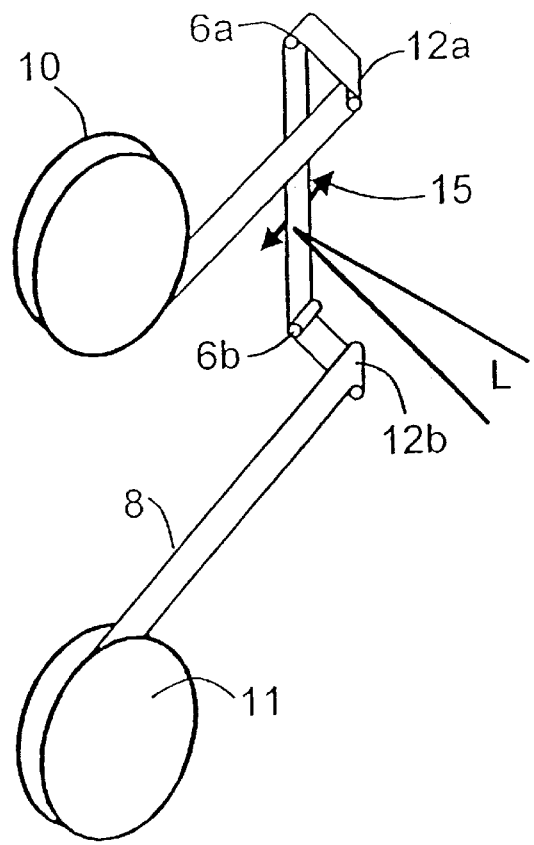
FIG. 4 shows a perspective view of a second tape guide mechanism.

A further exemplary embodiment of an apparatus for implementing the method for laser-induced thermal transfer is shown by FIG. 4. Here, the tape transport mechanism comprises a supply roll 10 and a wind-up roll 11, each arranged to be stationary (of course, it is also possible here for the designations 10 and 11 for the supply and wind-up rolls to be exchanged), the two rolls 6a, 6b arranged axially parallel to the substrate cylinder 1 in order to bring the transfer tape 8 into contact with the substrate surface, and two further deflection rolls 12a, 12b. Together with the laser imaging unit 2, the contact rolls 6a, 6b and the deflection rolls 12a, 12b can be traversed along the width B of the substrate cylinder 1 by means of a traversing unit in a fixed arrangement in relation to one another, but independently of the supply roll 10 and the wind-up roll 11, which are arranged to be stationary.

In the exemplary embodiments, the transfer film preferably has a tape width of 20 mm and a thickness of about 12 $\mu$m. In comparison with this, the width B of a substrate cylinder is typically 700 mm.

Figure 5:
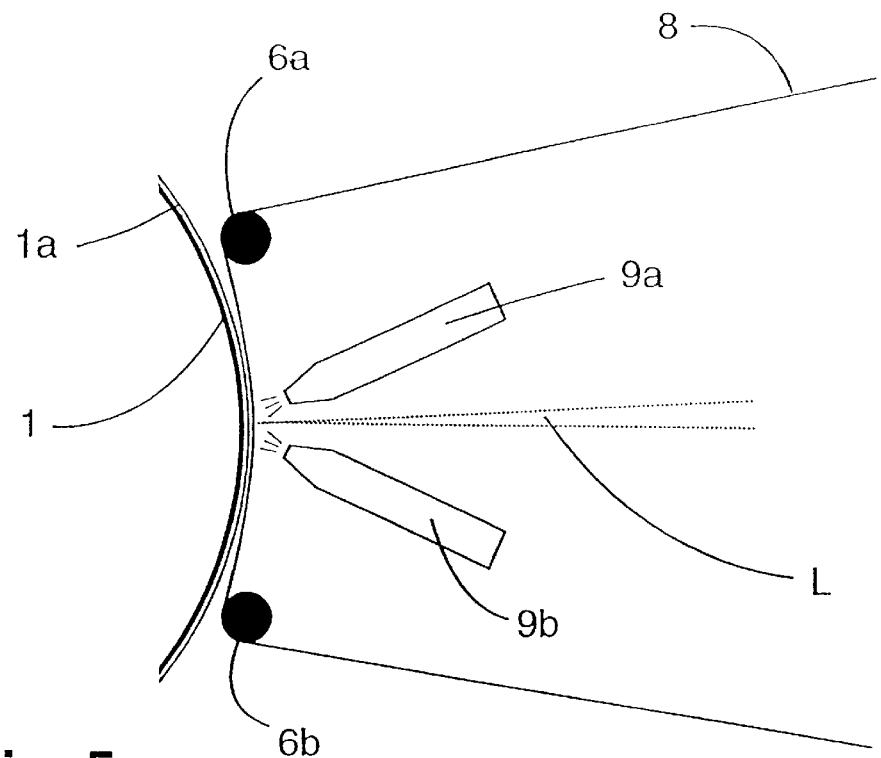
FIG. 5 shows a side view of a possible arrangement of blowing nozzles.
Figure 6:
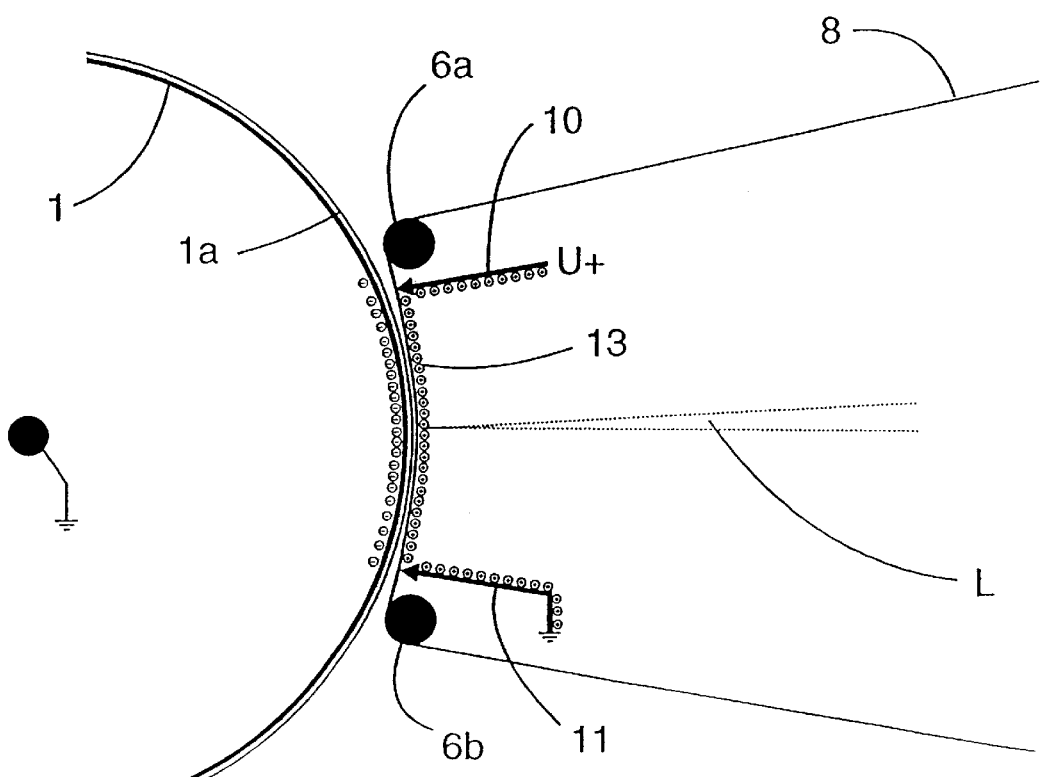
FIG. 6 shows a side view of an arrangement for electrostatically charging the transfer tape.

A development of the exemplary embodiment which was outlined by FIG. 1 is presented in FIGS. 5 and 6. In order to increase the contact force in relation to that which is produced by the wrap angle and the tape tension, in FIG. 5 air or a gas suitable for the purpose is blown, by means of one or more nozzles 9a, 9b, onto the transfer tape 8, preferably in the region of the imaging operation, that is to say the point of impingement of the laser beam or beams L. This increases the contact pressure, thus assists the operation of squeezing out the gas being produced and increases the frictional force between the substrate surface 1a and transfer tape 8.

In FIG. 6, this increase in the contact pressure is produced by electrostatic charging. A brush 10 applies charge 13 to the carrier side of the tape 8, that is to say the side facing away from the substrate 1a. In this case, the substrate cylinder 1 is conductive and grounded. By means of induction, charges of the opposite polarity are deposited under the substrate surface 1a and form a kind of plate cylinder with a resulting electrostatic force. The charge applied is then removed again by means of a grounded brush 11 after the imaging and contact zones have been passed through, before the transfer tape 8 is wound up again.

Of course, instead of the positive charges shown, negative charges may also be applied and, of course, charges may also be applied via devices other than brushes, for example via a corona discharge. Furthermore, the deflection rolls 6a, 6b may also well serve as charging and discharging electrodes, respectively, as could other more remote rolls, such as the rolls 7a, 7b in FIG. 1. In the latter case, attention must be paid to the adequate electrical insulation of the rolls 6a, 6b.

Figure 7:
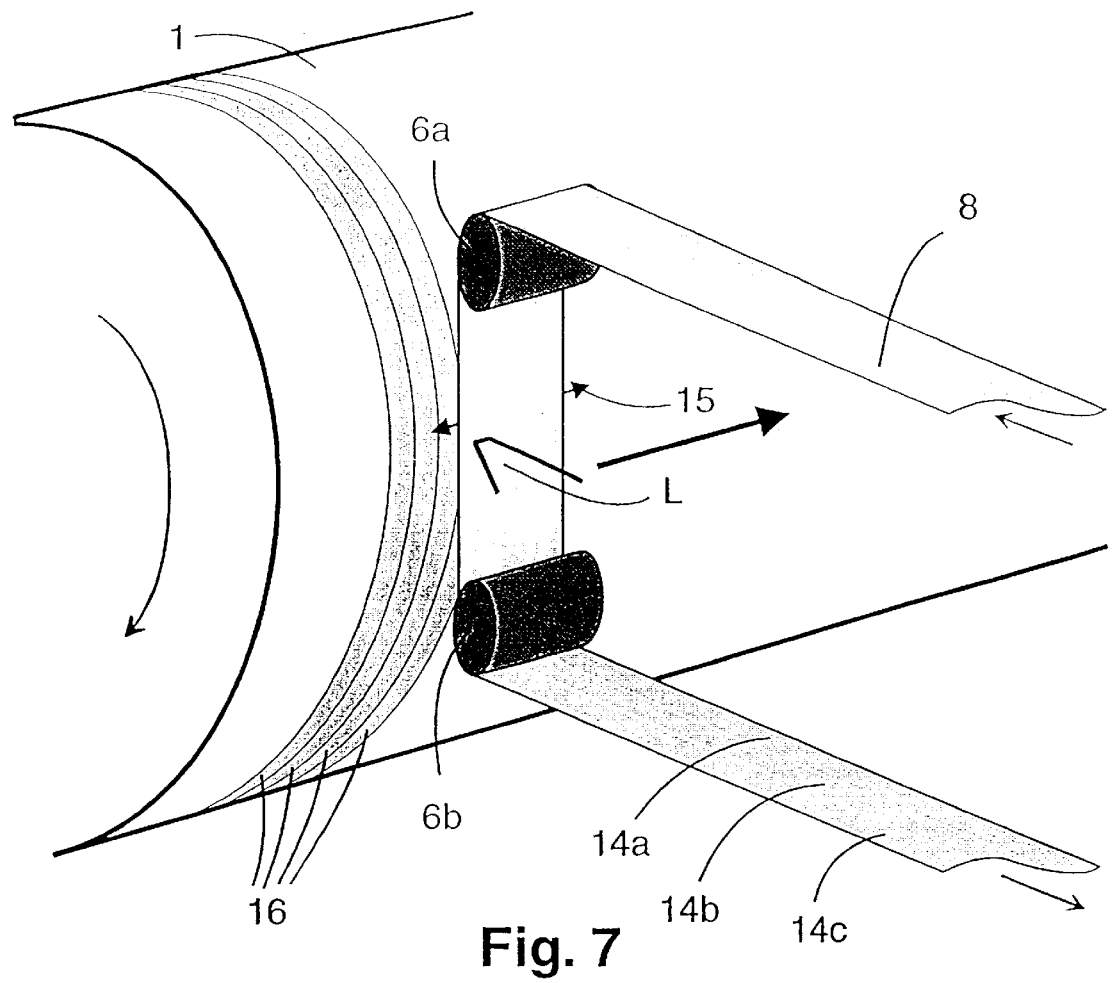
FIG. 7 shows a perspective view of an illustration to explain the lateral shifting of the transfer tape in relation to the laser beam.

A further advantageous embodiment of the inventive method, which readily works together with the previously cited developments, is described in relation to FIG. 7. At the points at which an image has already been transferred and which therefore cannot be used again over the entire imaging track 14a, 14b, 14c, similar to a carbon ribbon in a conventional typewriter. Nevertheless, it is advantageous not to have to change the transfer tape after each imaging operation. However, multiple use of the transfer tape can be realized only by providing unused tracks. According to the invention, this is realized by the tape having a width b which is a multiple of the imaging width t. The transfer tape is then divided up into imaging tracks 14a, 14b, 14c and one track is provided for each imaging operation. For this purpose, it must be possible for the transfer tape 8 to be shifted in a defined way in relation to the laser beam or beams L, as indicated by the arrows 15. Naturally, the apparatus as a whole still traverses in synchronism with the laser imaging unit over the substrate cylinder width B for an imaging operation, and writes one track 16 for each cylinder revolution, until the entire imaging area has been covered.

During the imaging operation, the tape is unwound from the supply roll 4 and wound up onto the wind-up roll 5. Following the imaging operation, in a position in which there is no contact between the transfer tape 8 and the substrate 1a or the substrate cylinder 1, the transfer tape 8 is then wound back again, shifted to a track which has not yet been used and is then ready for the next imaging operation. The tape is changed only when all the tracks have been used up.

Another refinement relating to multiple use is provided by enlarging the tape coils, by means of which a number of imaging operations one after another are then possible. This is limited, however, by the coil size. However, a combination of the two possibilities proves to be very advantageous, since the number of possible imaging operations one after another is multiplied by the number of possible imaging operations alongside one another.

In order to produce a single-color black print, a transfer tape with black pigmentation, preferably with carbon black particles, is needed. These particles absorb, in particular, both in the infrared wavelength range from 800 nm to 860 nm that is possible here for semiconductor laser diodes and in the range around 1060 nm for NdYAG and related solid-state lasers, and are thus equally suitable both as colored pigments and as laser absorbers. For colors, such as cyan, magenta and yellow, it is additionally necessary for absorber materials for the laser wavelength used to be incorporated in the transfer tape.

In order to produce a multicolor image, an imaging operation on the substrate has to be carried out for each color, in each case using a transfer tape which has a coating with the corresponding color, in order to produce a multicolor print in a known way. In the preferred case, the transfer tape is changed in such a way that a tape of one color in each case is accommodated in a tape cartridge. This tape cartridge is led up to the imaging unit, in a way similar to that used in a video recorder, and positioned in such a way that a tape arrangement such as that in FIG. 2, for example, is achieved. One possible arrangement of such a cartridge 17 in conjunction with the laser writing unit 2 is illustrated in FIG. 9.

Figure 9:
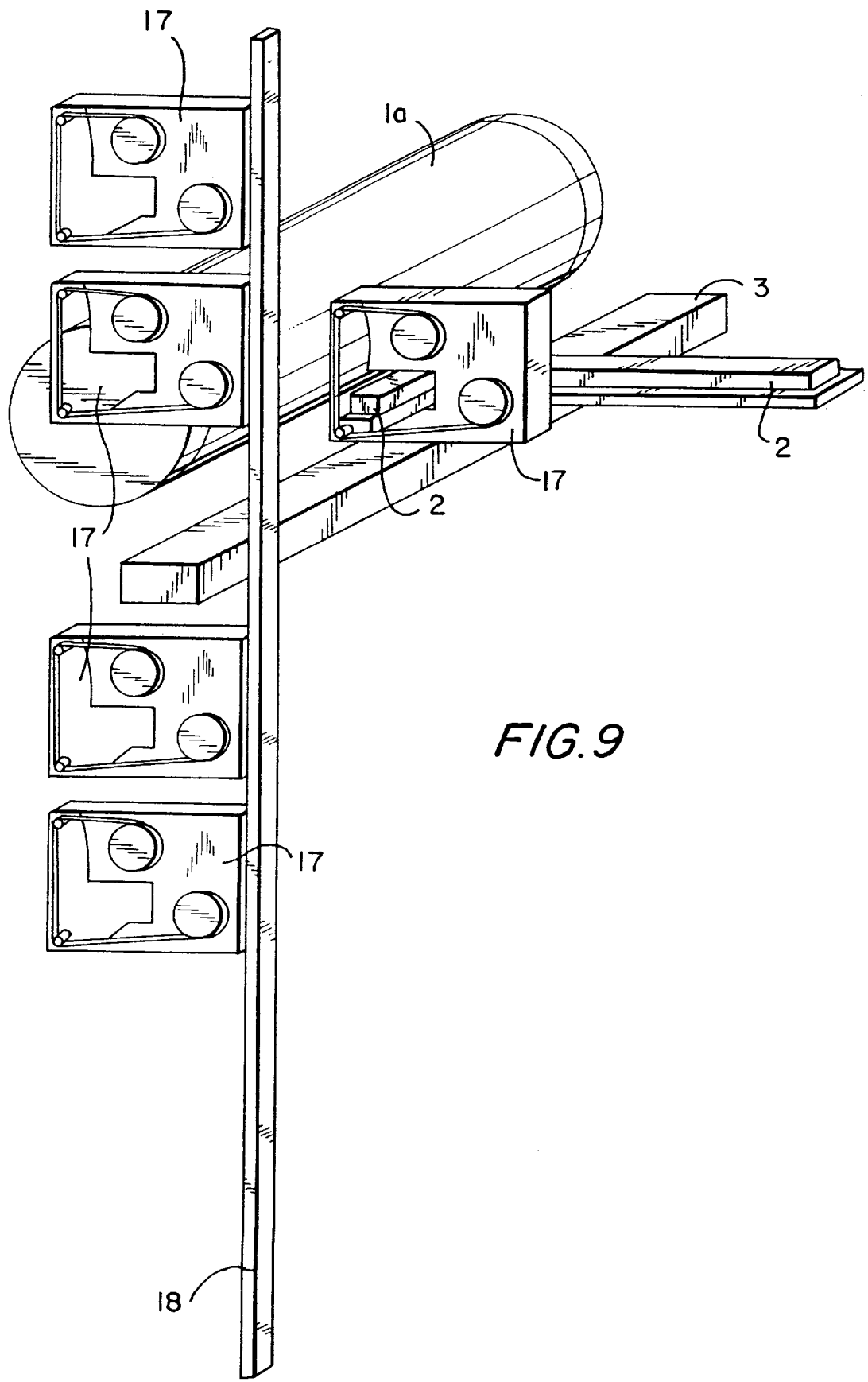
FIG. 9 shows a perspective illustration of an external drum exposer with a laser imaging unit and transfer tape cartridges and a store for a number of transfer tape cartridges, which may contain tapes with different colors.

According to FIG. 9, the tape cartridges are kept in a storage device 18, which provides a cartridge 17 to be held in the imaging unit in each case. The imaging unit travels to the edge of the traverse, takes up the respective cartridge 17 in the holders provided for this purpose, the drive motors are engaged, the transfer tape is positioned and the imaging operation can begin.

Following the imaging operation, the tape is moved back into the store and the cartridge with the transfer film for the subsequent color separation is fetched. According to FIG. 7, the transfer tape can also be used a number of times here, by being wound back following the imaging operation and remaining in the store until it is next required. For the next imaging operation, the tape is then positioned in relation to a free track. The management of the tracks and the requesting of new ones, that is to say the operation of changing cartridges with used-up tapes for new ones, may be carried out fully automatically via the computer-aided control of the imaging operation. In this case, the operator simply has to exchange the respective cartridge. This may be presented to him in a suitable way via the control of the supply store.

Furthermore, a number of cartridges of the same color may be kept in the supply store, depending on its capacity, in order to permit a larger number of imaging operations without manual intervention, that is to say cartridge change.

Furthermore, the method of generating prints is not restricted to the conventional color separations, such as cyan, magenta, yellow and black. It is possible to produce transfer tapes which represent specific special colors, a second color scale, such as the SWOP color scale in addition to the Euro color scale or a color scale having more than four colors, such as the seven-color scale of Prof. Küppers or the six-color scale from the Pantone company. Depending on the capacity of the store, these may be available in the system at the same time or only after the cartridges have been exchanged.

Of course, the exemplary embodiments described thus far are only some of many possible exemplary embodiments which may be used in suitably modified form by those skilled in the art in order to implement the inventive method.

Figure 8:
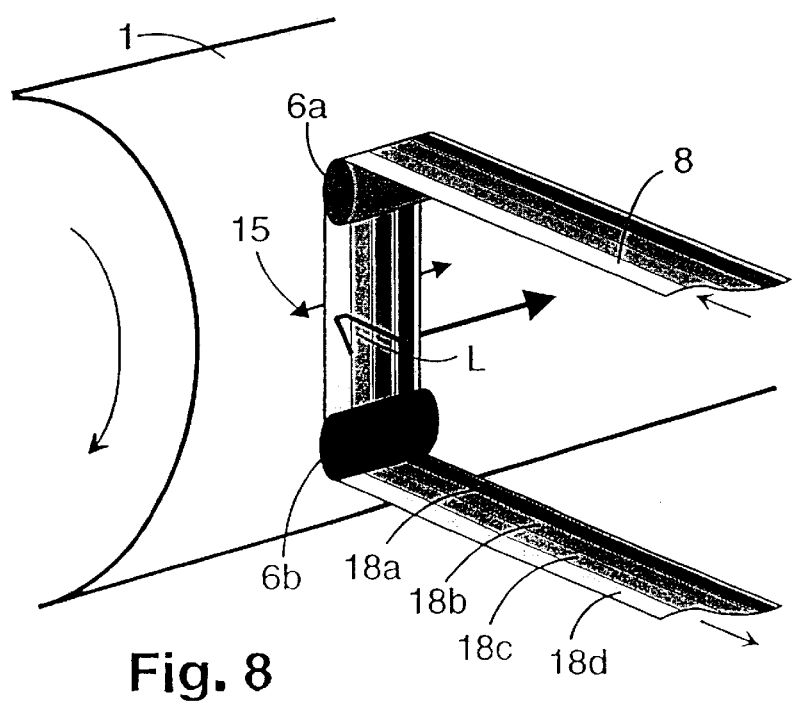
FIG. 8 shows an illustration to explain a transfer tape having different color separations.

A further embodiment for using the method according to the invention with more than one color separation is described in FIG. 8. Instead of changing cartridges each having a single-color transfer tape, use is made here of a transfer tape which contains the various color separations alongside one another. This makes it unnecessary to change the cartridges when imaging the color separations one after another. Instead, it is sufficient to shift the tape position in relation to the point of impingement of the writing beam or beams, in a manner also analogous to FIG. 7, in such a way that in each case the necessary color is presented to the writing beam or beams.

One variant of this is that the various color separations are located one behind the other instead of alongside one another. This arrangement may advantageously be used together with the development which is shown in FIG. 7, by which means a number of multicolor prints can be produced with one transfer tape without the tape being changed.

Furthermore, it is not absolutely necessary for the image to be transferred directly to the target substrate by means of the method according to the invention. Instead of the substrate 1a, an intermediate carrier film which accepts the transferred image elements may also be stretched over the cylinder 1. After all the color separations have been applied to this carrier film, the carrier film is removed and the image is transferred to the substrate in a subsequent step. This is preferably done by means of hot pressing, that is to say the carrier film is laid on the target substrate, the image elements to be transferred being between the carrier film and substrate, and the image elements are transferred to the substrate and fixed by means of a hot roll and under pressure. However, transfer, for example, just using pressure, without any heating, is also possible.

The invention is not limited by the embodiments described above which are presented as examples only but can be modified in various ways within the scope of protection defined by the appended patent claims.

We claim:

1. A method of producing a print, by controlled heating of a surface layer in accordance with an image using a laser beam from a laser imaging unit and by imaging a substrate arranged on a rotating substrate cylinder, comprising the steps of:

imaging the substrate using a tape-like transfer film having a width which is small in relation to a width of the substrate so that gas produced during laser imaging in an imaging operation can escape to a sufficient extent because the substrate and the transfer film are placed opposite each other over a small area;

continuously guiding the transfer film between the substrate and the laser beam during imaging close to a surface of the substrate;

moving the transfer film over the substrate width simultaneously and in synchronism with movement of the laser imaging unit controlling and setting one of contact and a gap between the transfer film and the substrate in dependence upon outer surface quality of the substrate so that frictional forces between the substrate and the transfer film can be used for controlling synchronous movement; and controlling the synchronous movement of the transfer film over the substrate using the frictional forces between the transfer film and the substrate.

2. A method according to claim 1, wherein the tape width of the transfer film is selected as a finction of a number of imaging channels of the laser imaging unit traversing along an axis of the rotating substrate cylinder.

3. A method according to claim 1, wherein the tape width of the transfer film is sufficiently large so as to permit a number of imaging tracks alongside one another, and further comprising the step of selecting a track that has not yet been used for each respective imaging operation.

4. A method according to claim 1, wherein the transfer film has a tape length which permits a number of successive imaging operations.

5. A method according to claim 1, wherein the imaging step includes using different transfer tapes with transfer material in respective color for imaging different color separations.

6. A method according to claim 1, including using one transfer film for imaging different color separations, respective colors being produced one after another by different sections of the transfer film.

7. A method according to claim 1, including using one transfer film for imaging different color separations, respective colors being produced alongside one another by different sections of the transfer film.

8. A method according to claim 1, wherein the transfer film is arranged in a cartridge and the transfer film is changed by changing the cartridge.

9. A method according to claim 1, including bringing the transfer film into contact with the substrate surface in a manner which is selected such that the film runs tangentially to the substrate surface and the transfer film is situated opposite the substrate surface only in that area which is currently being imaged.

10. A method according to claim 1, bringing the transfer film into contact with the substrate surface in a manner which is selected such that the transfer film wraps around the substrate surface at an angle of at least 5 degrees, so as to produce, depending on tension, of the transfer film contact forces and the frictional forces between the transfer film and the substrate surface.

11. A method according to claim 10, wherein the transfer film wraps around the substrate surface at an angle of 20 degrees.

12. A method according to claim 10, including increasing the contact force between the transfer film and the substrate by a blowing action over a surface area so that both the frictional force/contact force between the transfer film and the substrate is increased and squeezing out of gas is also assisted.

13. A method according to claim 10, including increasing the contact force between the transfer film and the substrate by charging the transfer film electrostatically with respect to the substrate whereby the contact force between the transfer film and the substrate is increased and hence both frictional force between the transfer film and the substrate is increased and squeezing out of gas is assisted, and removing the electrostatic charge on the transfer film after the film has been separated from the substrate surface and before it is wound up.

14. A method according to claim 10, including transporting the transfer film, during the imaging operation, in a common direction with rotational movement of the substrate cylinder and at a common speed.

15. A method according to claim 14, including actively controlling transport of the film taking into consideration different conveying behavior in case of static and sliding friction and using minimum transport energy as a parameter.

16. A method according to claim 14, including passively controlling transport of the film so that if a transfer tape speed is predefined with a smallest possible difference from a surface speed of the substrate, the difference is compensated for via plastic expansion of the film.

17. A method according to claim 1, including bringing the transfer film into contact with the substrate surface in a manner which is selected such that the transfer film is pressed against the substrate surface by a guide roll to produce the frictional forces between the transfer film and the substrate surface.

18. A method according to claim 17, including increasing the contact force between the transfer film and the substrate by a blowing action over a surface area so that both the frictional force/contact force between the transfer film and the substrate is increased and squeezing out of gas is also assisted.

19. A method according to claim 17, including increasing the contact force between the transfer film and the substrate by charging the transfer film electrostatically with respect to the substrate whereby the contact force between the transfer film and the substrate is increased and hence both frictional force between the transfer film and the substrate is increased and squeezing out of gas is assisted, and removing the electrostatic charge on the transfer film after the film has been separated from the substrate surface and before it is wound up.

20. A method according to claim 1, including, during the imaging operation, transporting the transfer film in a common direction with relative movement of the substrate cylinder but at a speed which is higher than a surface speed of the substrate.

21. A method according to claim 1, including transporting the transfer film in a direction opposite to the rotational movement of the substrate cylinder during the imaging operation.

22. A method according to claim 1, and further comprising the step of keeping tape tension of the transfer film constant during the imaging operation.

23. An apparatus for producing a print on a substrate by controlled heating of a surface layer in accordance with an image using a laser, comprising:

an imaging unit which emits a laser beam and can be traversed over a width of the substrate;

a tape-like transfer film having width that is small in relation to the substrate width;

tape transport means for transporting the film between the substrate and the imaging unit, the tape transport means including at least two rolls arranged axially parallel to the substrate width so as to bring the transfer film into contact with the substrate surface to generate frictional forces, at least one of the rolls being movable so as to be pressable against the substrate with a defined force in dependence on outer surface quality of the substrate so as to obtain a proper frictional force; and a traversing unit coupled to the imaging unit for moving the transport means.

24. An apparatus according to claim 23, wherein the tape transport means includes a supply roll and a wind-up roll, the tape transport means and the imaging unit being mounted on the traversing unit and coupled mechanically to each other.

25. An apparatus according to claim 24, wherein the tape transport means includes electronically controllable motors for driving the supply roll and the wind-up roll so that tape tension can be kept constant as the transfer film is transported.

26. An apparatus according to claim 24, wherein the two rolls for bringing the transfer film into contact with the substrate surface are arranged so that the film is oriented tangentially to the substrate surface.

27. An apparatus according to claim 23, wherein the tape transport means includes a supply roll and a wind-up roll, the tape transport means and the imaging unit being mounted on the traversing unit, both the transport means and the imaging unit having a separate carriage with a drive and being movable independently of each other.

28. An apparatus according to claim 27, wherein a leading roll of the two rolls is arranged so as to press the transfer film against the substrate so as to produce the frictional forces between the transfer film and the substrate surface.

29. An apparatus according to claim 28, and further comprising a nozzle arranged so as to blow an air stream against a surface area of the film to increase the contact pressure, of the film on the substrate and hence the frictional force, between the transfer film and the substrate.

30. An apparatus according to claim 27, wherein the two rolls for bringing the transfer film into contact with the substrate surface are arranged so that the film wraps around the substrate cylinder at an angle of at least 5 degrees.

31. An apparatus according to claims 30, wherein the two rolls are arranged so that the film wraps around the substrate cylinder at an angle of 20 degrees.

32. An apparatus according to claim 30, and further comprising means for applying a charge to a carrier side of the transfer film for increasing the frictional force between the transfer tape and the substrate surface, and means for removing the charge on the transfer film after contact between the transfer tape and the substrate surface.

33. An apparatus according to claim 23, wherein the tape transport means includes a supply roll and a wind-up roll, each arranged to be stationary, and at least two further deflection rolls, the two rolls and the deflection rolls being mounted to the traversing unit so as to be movable over the substrate width independently of the supply roll and the wind-up roll but together with the imaging unit.

34. An apparatus according to claim 23, wherein the imaging unit and the tape transport means for the transfer film are mounted together on the traversing unit for addressing different writing tracks alongside one another, at least the two rolls for bringing the transfer film into contact with the substrate surface being shiftable in a defined way in relation to the imaging unit and hence the laser beams.

35. An apparatus according to claim 23, and further comprising a plurality of tape cartridges, the tape-like transfer fihn being arranged in the tape cartridges, and storage means for holding the tape cartridges, the storage means being operative to provide a tape cartridge to be held in the tape transport means.

* * * * *